United States Patent
Sutton et al.

(10) Patent No.: US 10,073,511 B2
(45) Date of Patent: Sep. 11, 2018

(54) APPARATUS AND METHODS FOR EMBEDDED CURRENT MEASUREMENTS FOR PERFORMANCE THROTTLING

(71) Applicant: QUALCOMM Incorporated, San Diego, CA (US)

(72) Inventors: Todd Sutton, Del Mar, CA (US); Chris Rosolowski, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 302 days.

(21) Appl. No.: 15/087,827

(22) Filed: Mar. 31, 2016

(65) Prior Publication Data
US 2017/0285676 A1 Oct. 5, 2017

(51) Int. Cl.
| | |
|---|---|
| *G06F 1/32* | (2006.01) |
| *G01R 19/00* | (2006.01) |
| *G01R 17/00* | (2006.01) |
| *G01R 19/165* | (2006.01) |
| *G05F 1/625* | (2006.01) |

(Continued)

(52) U.S. Cl.
CPC ........... *G06F 1/3234* (2013.01); *G01R 17/00* (2013.01); *G01R 19/003* (2013.01); *G01R 19/0092* (2013.01); *G01R 19/165* (2013.01); *G05F 1/625* (2013.01); *G06F 1/3206* (2013.01); *G06F 1/3287* (2013.01); *H02J 7/00* (2013.01); *H02J 13/0013* (2013.01)

(58) Field of Classification Search
CPC .......... G06F 1/3203; G06F 1/26; G06F 1/324; G06F 1/3296; G06F 1/3206; G06F 1/3237; G06F 1/3243; G06F 1/3287; G06F 1/329; G06F 1/3234; G01R 19/003; G01R 19/0092; G01R 19/165; G01R 31/31721

See application file for complete search history.

(56) References Cited

U.S. PATENT DOCUMENTS

| | | | |
|---|---|---|---|
| 6,304,978 B1 * | 10/2001 | Horigan | G06F 1/26 713/322 |
| 6,931,559 B2 | 8/2005 | Burns et al. | |
| 7,178,043 B2 | 2/2007 | Nakazato | |

(Continued)

FOREIGN PATENT DOCUMENTS

| | | |
|---|---|---|
| EP | 2400368 A2 | 12/2011 |
| EP | 2466711 A1 | 6/2012 |

OTHER PUBLICATIONS

International Search Report and Written Opinion—PCT/US2017/019482—ISA/EPO—dated Jun. 23, 2017.

*Primary Examiner* — Ryan Johnson
(74) *Attorney, Agent, or Firm* — Arent Fox, LLP

(57) ABSTRACT

A circuit comprising an ECM system is provided. The circuit includes a current monitor circuit configured to monitor the ECM system to measure a set of currents supplied to a set of circuits. The circuit also includes an alert circuit configured to generate an alert based on at least one current of the set of currents in comparison to at least one threshold. The circuit further includes a throttle circuit configured to throttle a performance of at least one circuit in order to decrease the current to the at least one circuit based on the generation of the alert. The current used by the circuit may act as an analogue for the system power used. Accordingly, the current used by the circuit may be used to determine when to throttle one or more aspects of the functionality of the circuit.

21 Claims, 4 Drawing Sheets

(51) Int. Cl.
*H02J 7/00* (2006.01)
*H02J 13/00* (2006.01)

(56) References Cited

U.S. PATENT DOCUMENTS

| | | |
|---|---|---|
| 7,281,140 B2 | 10/2007 | Burns et al. |
| 7,793,125 B2 | 9/2010 | Berry et al. |
| 8,862,924 B2 | 10/2014 | Emberling et al. |
| 8,996,736 B2 * | 3/2015 | Alarcon .................. G05F 1/625 710/5 |
| 2005/0289367 A1 | 12/2005 | Clark et al. |
| 2013/0120010 A1 | 5/2013 | Edgar, III et al. |
| 2013/0249521 A1 * | 9/2013 | Cheng ....................... G06F 1/28 323/304 |
| 2017/0068296 A1 * | 3/2017 | Mair ........................ G06F 1/28 |

\* cited by examiner

APPARATUS AND METHODS FOR EMBEDDED CURRENT MEASUREMENTS FOR PERFORMANCE THROTTLING

BACKGROUND

Field

The present disclosure relates generally to electronic systems, and more particularly, to current monitoring of a circuit within an electronic system.

Background

Performance of various mobile electronic devices, such as so called "smart phones," is generally increasing. As the performance of these mobile electronic devices increase, processing circuitry or other circuitry within the mobile electronic devices may generally use additional power as compared to lower performing mobile electronic devices. As more power is used by circuitry within a mobile electronic device, the current supplied to that mobile electronic device by a battery generally increases. In some instances, the increased current draw may exceed the thermal limits of the mobile electronic device and the power delivery capabilities of the battery supplying the power to the mobile electronic device.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In a battery operated mobile electronic device, as more power is used by circuitry within that device, more current is generally drawn from the battery. In some instances, the increased current draw may exceed the thermal limits of the mobile electronic device and the power delivery capabilities of the battery supplying the power to the mobile electronic device.

In some examples, current to one or more power rails within a circuit used in the mobile electronic device may be used to determine when to throttle one or more aspects of the functionality of that circuit within the mobile electronic device. For example, in some cases, current used in that circuit or by one or more particular power rails within that circuit may act as an analogue for the system power used in order to predict when an increased current draw of the system may exceed the thermal limits of the mobile electronic device, the power delivery capabilities of the battery supplying the power to the mobile electronic device, or both.

In an aspect of the disclosure, a method, a computer-readable medium, and an apparatus are provided. The current measuring circuit comprising an embedded current measuring (ECM) system. The current measuring circuit including a current monitor circuit configured to monitor the ECM system to measure a set of currents supplied to a set of circuits. The current measuring circuit also including an alert circuit configured to generate an alert based on at least one current of the set of currents in comparison to at least one threshold. The current measuring circuit further including a throttle circuit configured to throttle a performance of at least one circuit of the set of circuits in order to decrease the current to the at least one circuit based on the generation of the alert.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

In some examples, current to one or more power rails within a circuit used in the mobile electronic device may be used to determine when to throttle one or more aspects of the functionality of that circuit within the mobile electronic device. For example, in some cases, current used in that circuit or by one or more particular power rails within that circuit may act as an analogue for the system power used or power used by a subsystem to predict when an increased current draw of the system may exceed the thermal limits of the mobile electronic device, the power delivery capabilities of the battery supplying the power to the mobile electronic device, or both.

Some example systems may include a "fuel gauge" that may be capable of monitoring total battery usage. The "fuel gauge" provides no knowledge of which subsystem is consuming the current, however, just total battery usage. Additionally, many electronic systems, such as thin modems, do not include a "fuel gauge." (The term "thin modem" may generally refer to a communications processor, many of which do not include a capability to monitor total battery usage.) The systems and methods described herein may, for systems without a "fuel gauge," provide software with feedback on the total peak current.

Some example systems may include a "battery droop detector" that may be capable of monitoring large droops in a battery voltage. Large droops in the battery voltage may be indicative of a high current event. "Battery droop detectors" provide no knowledge of which subsystem is consuming the current, however, just some indication that a high current event may be occurring.

Figure 1:
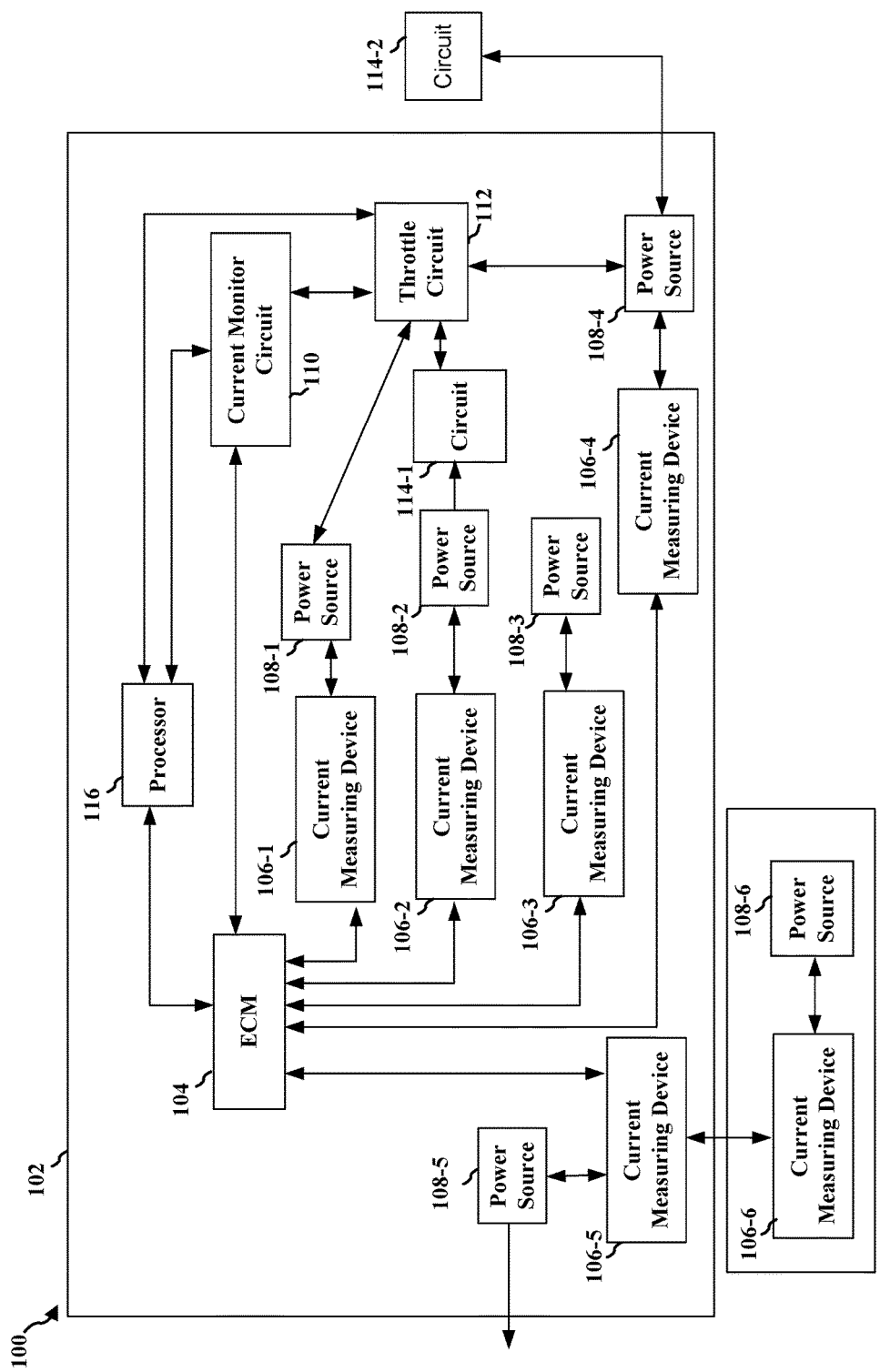
FIG. 1 is a block diagram illustrating functional blocks of a current measuring circuit in accordance with the systems and methods described herein.

FIG. 1 is a block diagram 100 illustrating functional blocks of a current measuring circuit in accordance with the systems and methods described herein. As illustrated in FIG. 1, the circuit may include an integrated circuit (IC) 102. The IC 102 may include an ECM system 104. The ECM system 104 may be used to make current measurements during a test mode of the IC 102. During a test mode, test circuitry in the IC 102 (such as the ECM system 104, as well as other test circuitry) may perform test functions. Example test functions may include tests to check the functionality of the IC 102, tests to check the physical integrity of the IC 102, or tests to take current measurements of circuitry in the IC 102, e.g., while circuitry in the IC 102 is being tested.

In some examples, the ECM system 104 may be used for testing. The testing may be performed during the development of systems incorporating the IC 102 having the ECM system 104. For example, the testing may be performed on a mobile telephone handset incorporating IC 102. During development of the mobile telephone handset incorporating the IC 102, the ECM system 104 may measure current consumption by the IC 102 or by other ICs or systems on a chip (SOCs) powered, controlled, and/or monitored by the IC 102. Furthermore, the ECM system 104 may monitor current when the mobile telephone handset incorporating the IC 102 is fielded, e.g., installed in a mobile telephone handset and functioning in mission mode. Accordingly, the ECM system may be used throughout the life of a mobile telephone handset or other electronic device incorporating the ECM system, including development and fielding of the electronic device.

Using the ECM system 104 to measure current consumption by the IC 102 during development of a mobile telephone handset may allow for development of such a mobile telephone handset (or other electronic device) without the need for a "stretch phone" which may be used to break-out different signals for measurement during development. A stretch phone is a test fixture, together with components of a mobile telephone handset installed in the test fixture. The components of a mobile telephone handset may be, for example, printed circuit boards. The stretch phone may be used to test a mobile telephone handset during the development of the mobile telephone handset. When a stretch phone is used, performance is generally not fully representative of the mobile telephone handset, however. First, generally only a limited number of mobile telephone handset components, e.g., circuit boards, are used in conjunction with the stretch phone fixture. The limited number of mobile telephone handset components may not be representative of the functionality of some number of production mobile telephone handsets. Furthermore, the test fixture may change the functioning of the underlying mobile telephone handset. For example, the thermal characteristics of the stretch phone may be completely different from the production mobile telephone handset because the mobile telephone handset may generally be within a case, while the stretch phone may generally not be in a case or may not be within the case used for the production mobile telephone handset. When a mobile telephone handset is installed in the stretch phone test fixture it may be outside of a case to allow signals to be accessed by test equipment, for example.

In some examples, test functions may be performed during the manufacturing of the IC 102. IC 102 may have been manufactured as part of a wafer. FIG. 1 illustrates a circuit including the IC 102 which may already be separated from the wafer; accordingly, the wafer from which the IC 102 came is not illustrated in FIG. 1. Furthermore, the IC 102 may subsequently be packaged. Packaging of IC 102 is not illustrated in FIG. 1.

The circuitry for IC 102 may be tested while the circuitry for IC 102 is still part of a wafer. For example, test functions may be performed on the circuitry of IC 102 (and other ICs on the wafer) at the wafer level during testing of the wafer. The circuitry of IC 102 may be tested after the wafer is separated into individual dies. (A die is a generally rectangular piece of the wafer.) For example, test functions may be performed on the individual dies, including the die that is IC 102. Furthermore, in some examples, test functions may be performed after the manufacturing of the IC 102. For example, test functions may be performed after the die of the IC 102 is packaged. Generally, this testing may be performed before the packaged IC 102 is installed on a printed wire board or otherwise installed for deployment in the field. In some examples, test functions may be performed during one or more of testing of the wafer, testing of the individual dies, testing of the IC 102 after the IC 102 is packaged, or some combination of these.

ICs, such as IC 102, may be capable of operation in multiple modes, including one or more "mission modes" and one or more test modes. The one or more test modes may be used to test the IC 102 during manufacture of the IC 102, as discussed above. In mission mode, circuitry in IC 102 may perform mission functions that the IC 102 is designed to perform when the IC 102 is deployed in the field, e.g., a packaged IC installed on a printed wire board (PWB) deployed in the field.

As discussed above, the ECM system 104 may typically be used to debug power related issues during the manufacture of the IC 102. The ECM system 104 may also be used in the one or more mission modes, however. In other words, the ECM system 104 may also be used to monitor power related issues while the IC 102 is operating for the IC's intended purpose in the field. For example, the ECM system 104 may be used to alert a system incorporating the IC 102 to high current events on the IC 102.

In one example, the ECM system 104 may be used to alert a processor 116 on the IC 102 to high current events on the IC 102. In some examples, the alert may be an interrupt to the processor 116. In another example, the ECM system 104 may be used to alert a processor in a system incorporating the IC 102 to high current events on the IC 102. In some examples, the ECM system 104 may be used to generate an alert to high current events on the IC 102 for other circuitry in the system or other circuitry on the IC 102. In some example, the ECM system 104 may be used to generate an alert to high current events on the IC 102 for some combination of a processor or processors on the system, a processor 116 (or processors) on the IC 102 (which is generally also in the system), or other circuitry on the IC 102 or in the system.

The ECM system 104 may include one or more embedded current measuring devices 106 to measure current at one or more locations for one or more circuits on the IC 102. The current measuring devices 106 may measure current supplied by one or more power sources 108 used by the IC 102. The power sources 108 may be power regulators or power supplies configured to convert power supplied by a battery to a desired voltage. The power sources 108 are connected to power rails that distribute power from the power sources within IC 102 or external to IC 102 or both. Power rails may be connection points where power is distributed to the IC 102. The IC may use multiple voltage levels and, accordingly, the IC may have a plurality of power rails. Generally the IC will have at least two power rails, e.g., a ground and a positive or negative voltage source.

In some examples, the current measuring devices 106 may each be located adjacent to various locations where power enters the IC 102, e.g., the current measuring devices 106 may be located near one or more power inputs on the IC 102. In other examples, the current measuring devices 106 may each be centrally located, for example, at a central location where power is distributed to the IC 102. Further, in some examples, a combination of current measuring devices 106 located adjacent to various locations where power enters the IC 102 and centrally located current measuring devices 106 may be used. Some example systems add no new hardware, but rather, such systems may re-use the existing ECM system 104.

The IC 102 may also include a current monitor circuit 110. The current monitor circuit 110 may be configured to communicate with the ECM system 104 to measure a set of currents supplied to a set of circuits. In some examples, the set of circuits may be within the IC 102. In some examples, the set of circuits may be external to the IC 102. In yet other examples, the set of circuits may include circuits within the IC 102 and circuits external to the IC 102. The current monitor circuit 110 may include one or more processors, digital logic, or other circuitry to monitor the ECM system 104 to measure a set of currents supplied to a set of circuits. For example, one or more processors, digital logic, or other circuitry may be coupled to the ECM system 104 within the current monitor circuit 110. The one or more processors, digital logic, or other circuitry may receive data from the ECM system 104 indicating current measurements from the current measuring devices 106. Accordingly, the one or more processors, digital logic, or other circuitry may measure a set of currents supplied to a set of circuits or may process measurements of the set of currents supplied to a set of circuits.

The set of currents may include a first current, $i_1$, based on a current measured by a first current measuring device 106-1. The current measured by the first current measuring device 106-1 may be a current supplied by a first power source 108-1. The set of currents may also include a second current, $i_2$, based on a current measured by a second current measuring device 106-2. The current measured by the second current measuring device 106-2 may be a current supplied by a second power source 108-2.

Additionally, the set of currents may include a third current, $i_3$, based on a current measured by a third current measuring device 106-3. The current measured by the third current measuring device 106-3 may be a current supplied by a third power source 108-3. The set of currents may also include a fourth current, $i_4$, based on a current measured by a fourth current measuring device 106-4. The current measured by the fourth current measuring device 106-4 may be a current supplied by a fourth power source 108-4. The set of currents may also include a fifth current, is, based on a current measured by a fifth current measuring device 106-5. The current measured by the fifth current measuring device 106-5 may be a current supplied by a fifth power source 108-5. Additionally, the set of currents may also include a sixth current, $i_6$, based on a current measured by a sixth current measuring device 106-6. The current measured by the sixth current measuring device 106-6 may be a current supplied by a sixth power source 108-6. In one example (illustrated), the sixth current measuring device 106-6 may be routed through the fifth current measuring device 106-5 to the ECM 104. In another example, the sixth current measuring device 106-6 may be routed directly to the ECM 104.

One or more functions of the currents, $f_1(i_1)$, $f_2(i_2)$, $f_3(i_3)$, $f_4(i_4)$, $f_5(i_5)$, or $f_6(i_6)$, or a combination G of one or more of $f_1(i_1)$, $f_2(i_2)$, $f_3(i_3)$, $f_4(i_4)$, $f_5(i_5)$, or $f_6(i_6)$ may be compared to one or more thresholds. The ECM 104 obtains the measurements, and provides the data to the current monitor circuit 110. The current monitor circuit 110 sends an alert to the throttle circuit 112 and/or the processor 116 based on comparisons of the received measurement data to one or more thresholds. For example, assuming an alert is to be generated based on measurements from the current measuring device 106-2, the current monitor circuit 110 may compare $G=f_2(i_2)$ to a threshold. In a specific example, $f_2(i_2)$ is equal to the current $i_2$, and the current monitor circuit 110 generates an alert to throttle the circuit 114-1 when the current $i_2$ is greater than a threshold. In another specific example, $f_2(i_2)$ is equal to the change in current $di_2/dt$, and the current monitor circuit 110 generates an alert to throttle the circuit 114-1 when the change in current $di_2/dt$ is greater than a threshold.

While IC 102 is illustrated as providing power to circuit 114-1, which is internal to IC 102, IC 102 may generally also be used to provide power to other ICs that are external to IC 102. For example, IC 102 may provide power to circuit 114-2 that may be part of another IC, e.g., circuit 114-2 may be external to IC 102. Accordingly, in another example, a power source 108-4 may provide power to a circuit 114-2 that is external to IC 102. The current from power source 108-4 may be monitored by current monitor circuit 110, which may generate an alert to throttle the circuit 114-2 when the current is greater than a threshold or the change in current is greater than a threshold.

The functions $f_x$ may include addition, subtraction, multiplication, division, differentiation, integration, or other mathematical functions with respect to the current $i_x$. The function G may also include addition, subtraction, multiplication, division, differentiation, integration, or other mathematical functions. For example, if the function G is a sum, the function G may equal the following:

$$G=\Sigma C_j f_j(i_j). \quad\quad\quad (EQ.\ 1)$$

In one example, the current monitor circuit 110 may be configured to determine when G is greater than one or more thresholds. For example, a system including the IC 102 may send a first alert when G exceeds a first threshold and a second alert when G exceeds a second threshold. The first alert may cause a first throttling of one or more of the circuits 114-1, 114-2. The second alert may cause a second throttling of one or more of the circuits 114-1, 114-2. The second throttling may be greater than the first throttling.

As discussed above, the current monitor circuit 110 sends an alert to the throttle circuit 112 and/or the processor 116 based on comparisons of the received measurement data to one or more thresholds. In one configuration, the current monitor circuit 110 sends an alert to the throttle circuit 112 (which may include a processor or may be a processor) based on comparisons of the received measurement data to one or more thresholds. The throttle circuit 112 may then cause a throttling of one or more of the circuits 114-1, 114-2. In another configuration, the current monitor circuit 110 sends an alert to the processor 116 based on comparisons of the received measurement data to one or more thresholds. The processor 116 may then control the throttle circuit 112 so that the throttle circuit 112 may cause a throttling of one or more of the circuits 114-1, 114-2.

FIG. 1 illustrates a connection between power source 108-2 and circuit 114-1 and a connection between power source 108-4 and circuit 114-2. While a single line (between each) is illustrated, it will be understood that the connection illustrated may represent one or more power connections. In an example including multiple power connections to a circuit 114-1, 114-2 or a group of circuits, the current measurements may be summed to determine the total current used for the circuit 114-1, 114-2 or the group of circuits.

In some examples, a Power Management Integrated Circuit (PMIC) Programmable Boot Sequencer (PBS) may compare the thresholds while the ECM system 104 is activated. The ECM system may be activated, for example, by processor 116, current monitor circuit 110, or other circuitry. The PMIC may be part of the ECM system 104. If any of the thresholds is exceeded, the PBS may send an alert to a processor, e.g., the processor 116 or a processor external to IC 102. The alert may cause the processor to throttle one process. Some examples may incorporate more than one PMICs to perform the functionality described above.

The thresholds may be defined by software, hardware, or some combination of software and hardware. Example thresholds include, but are not limited to
  (1) TOTAL_CURRENT_HIGH1: The sum of ECM channels has exceeded a safe threshold and software should take conservative steps to reduce current;
  (2) TOTAL_CURRENT_HIGH2: The sum of the ECM channels is very high and software needs to take aggressive steps to reduce current;
  (3) REGx_CURRENT_HIGH: The power rail current has exceeded a safe threshold and software should take conservative steps to reduce current on this particular power rail only; and
  (4) REGx_TRANSIENT_EVENT: ECM recorded a high di/dt event.

Generally software may not need to take steps to reduce current for a transient event; however, implementations may vary. In some examples, software may take steps to reduce current for an ECM recorded high di/dt event. REGx_CURRENT_HIGH and REGx_TRANSIENT_EVENT may be measured on a per power rail basis. In other words, the power rail current, changes in power rail current (di/dt), and/or some other function of the current may be measured for each of the power rails in the IC 102 individually.

As described herein, the alert circuit may be further configured to generate an alert based on at least one measured current of the set of currents in comparison to at least one threshold. Generating an alert based on at least one current of the set of currents in comparison to at least one threshold may include generating an alert for at least one of a plurality of power rails in the IC. The alert may be generated for the at least one of the plurality of power rails based on the current to the at least one of the plurality of power rails. Additionally, the alert circuit may be further configured to generate one alert for each power rail that is not a ground power rail. Each alert may be based on a current to one of the plurality of power rails that is not a ground. In some examples, each alert may map to a single power rail, e.g., a single supply voltage. In some examples, the alert circuit is further configured to generate one alert based on a sum of two or more currents, each current to one of the plurality of power rails. In some examples, the alert circuit is further configured to generate, in addition to the one alert that is generated based on a sum of two or more currents, one alert is for each power rail of the plurality of power rails in the IC that is not a ground. Additionally, each alert generated for each power rail of the plurality of power rails in the IC that is not a ground is based on a current to one of the plurality of power rails in the IC that is not a ground. Furthermore, each alert generated for each power rail may map to a single power rail. As described above, generally non-ground power rails will be the power rails monitored to generate alerts. It will be understood, that the systems and methods described herein may also be applied to monitor ground power rails.

In one example mobile electronic device, the ECM system 104 makes continuous measurements which are aggregated by a micro-sequencer within the current monitor circuitry 110. In another example mobile electronic device, the ECM system 104 makes continual measurements which are aggregated by the micro-sequencer. In yet another example mobile electronic device, the ECM system 104 makes periodic measurements which are aggregated by the micro-sequencer. The micro-sequencer may check each sample and, if the sample exceeds a software programmable threshold, an alert may be sent to a host processor on the IC 102, which may be a system on a chip (SOC). The micro-sequencer may also sum up all of the samples and generate an alert if the total current exceeds a software programmable threshold. The samples may be stored in a local memory in case the host software needs to further post-process the samples.

The IC 102 may further include a throttle circuit 112 configured to throttle a performance of at least one the circuit 114-1 of the set of circuits within the IC 102 and/or at least one of the circuit 114-2 of a set of circuits outside the IC 102. Throttling may be used to decrease the current to the at least one circuit based on the generation of the alert. The throttle circuit 112 may use current usage information to throttle performance of the IC 102 before an over-temperature event or battery dip shuts down a mobile electronic device incorporating the IC 102. Because the ECM system 104 may provide a breakdown of currents on each power rail, current limiting software in the mobile electronic device, e.g., running on a processor 116 on the IC 102, may selectively decide which sub-system to throttle. In some examples, the throttle circuit 112 may throttle a performance of the circuit 114-1, 114-2 directly, e.g., by signaling the circuit 114-1, 114-2 to enter a lower power state or signaling the circuit 114-1, 114-2 to slow processing, or by otherwise signaling the circuit 114-1, 114-2 to reduce the current draw to circuit 114-1, 114-2 in some way. In some examples, the throttle circuit 112 may signal one of the power sources 108 and the power source 108 may decrease a current or a voltage to a circuit or circuits to which the power source 108 is supplying power. (For example, the power source 108 may measure current and decrease the voltage to a circuit or circuits until a desired current level is reached.) Generally, the throttle circuit 112 may send a signal to one of the power sources 108 or other circuitry, such as the processor 116 requesting the throttling of the power source 108 to decrease a voltage to a circuit or circuits to which the power source 108 is supplying power.

The ECM system 104 may provide a power rail-by-power rail breakdown of the current usage. Accordingly, the systems and methods described herein may alert the software, e.g., running on processor 116, on a per rail basis so that the systems to throttle may be determined. Accordingly, the systems and methods described herein may fine tune which systems to throttle (e.g., modem, graphics core, camera) to maximize current reduction and maximize user experience (as opposed to brute force making every system in IC 102 reduce performance).

Potential bill-of-materials and area savings may be gained by reducing the size of power regulators (and associated inductors) by better managing power usage and throttling. Additionally, the systems and methods described herein may provide for longer sustained higher performance (better throughput for a modem) by allowing for the high performance as long as over usage of power is not an issue and avoiding brute force methods where making every system's performance is reduced. In some examples, the circuitry illustrated in a single IC (IC 102) may be spread across a plurality of ICs.

Figure 2:
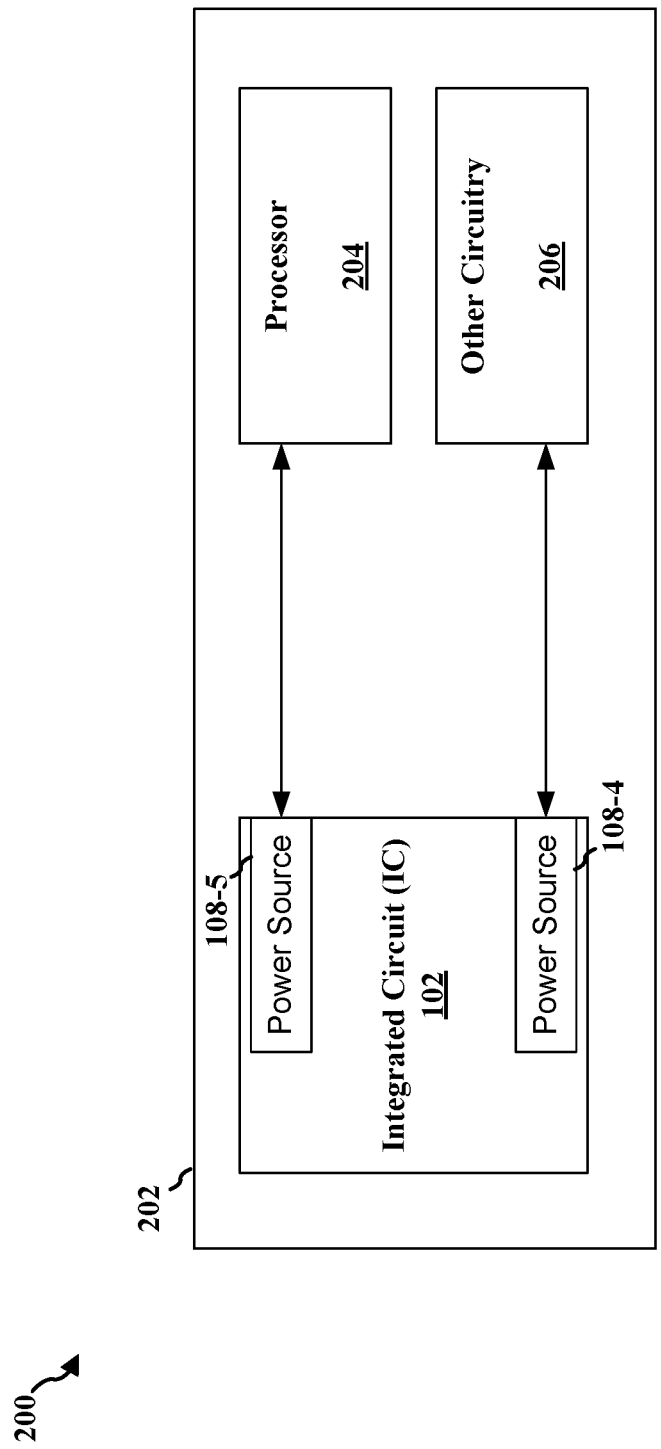
FIG. 2 is a block diagram illustrating functional blocks of a system incorporating the current measuring circuit of FIG. 1 in accordance with the systems and methods described herein.

FIG. 2 is a block diagram 200 illustrating functional blocks of a system incorporating the circuit of FIG. 1 in accordance with the systems and methods described herein. The IC 102 may be mounted on a printed wire board in system 202, for example. Additionally, as described above, the IC 102 may include an ECM system 104 that may be used to make current measurements during a test mode of the IC 102. The ECM system 104 may typically be used to debug power related issues during the manufacture of the IC 102. The ECM system 104 may also be used in the one or more mission modes, however.

The IC 102 may alert the system 202 that the IC 102 is experiencing a high current event. In one example, the ECM system 104 may be used to alert a processor 116 on the IC 102 to high current events on the IC 102. In another example, the ECM system 104 on the IC 102 may be used to alert a processor 204 in the system 202 incorporating the IC 102 to high current events on the IC 102. The processor 204 may be powered by the power source 108-5 of IC 102. In some examples, the ECM system 104 may be used to generate an alert to high current events on the IC 102 for other circuitry 206 in the system 202 or other circuitry on the IC 102. The other circuitry 206 may be powered by the power source 108-4 of IC 102. In some example, the ECM system 104 may be used to generate an alert to high current events on the IC 102 for some combination of a processor 204 (or processors) on the system 202, a processor 116 (or processors) on the IC 102 (which is generally also in the system 202), or other circuitry 206 on the IC 102 or in the system 202.

As illustrated in FIG. 2, generally, the IC 102 may be used to control power supplied to external circuitry, i.e., circuitry external to IC 102. Accordingly, IC 102 may instruct or request that power to one or more of processor 204 and/or other circuitry 206 be throttled. The power sources 108-4, 108-5 are illustrated as being internal to the IC 102. In other examples, one or more power sources may be external to the IC 102 and the IC 102 may provide monitoring of the external power sources. The IC 102 may instruct or request that power to one or more of processor 204 and/or other circuitry 206 from power sources 108-4, 108-5 (or external power sources) be throttled. The power sources 108-4, 108-5 (or external power sources) may provide multiple currents to the processor 204 or other circuitry 206, respectively. These currents may be summed to determine a total current used by one or more of the processor 204 and/or the other circuitry 206.

Figure 3:
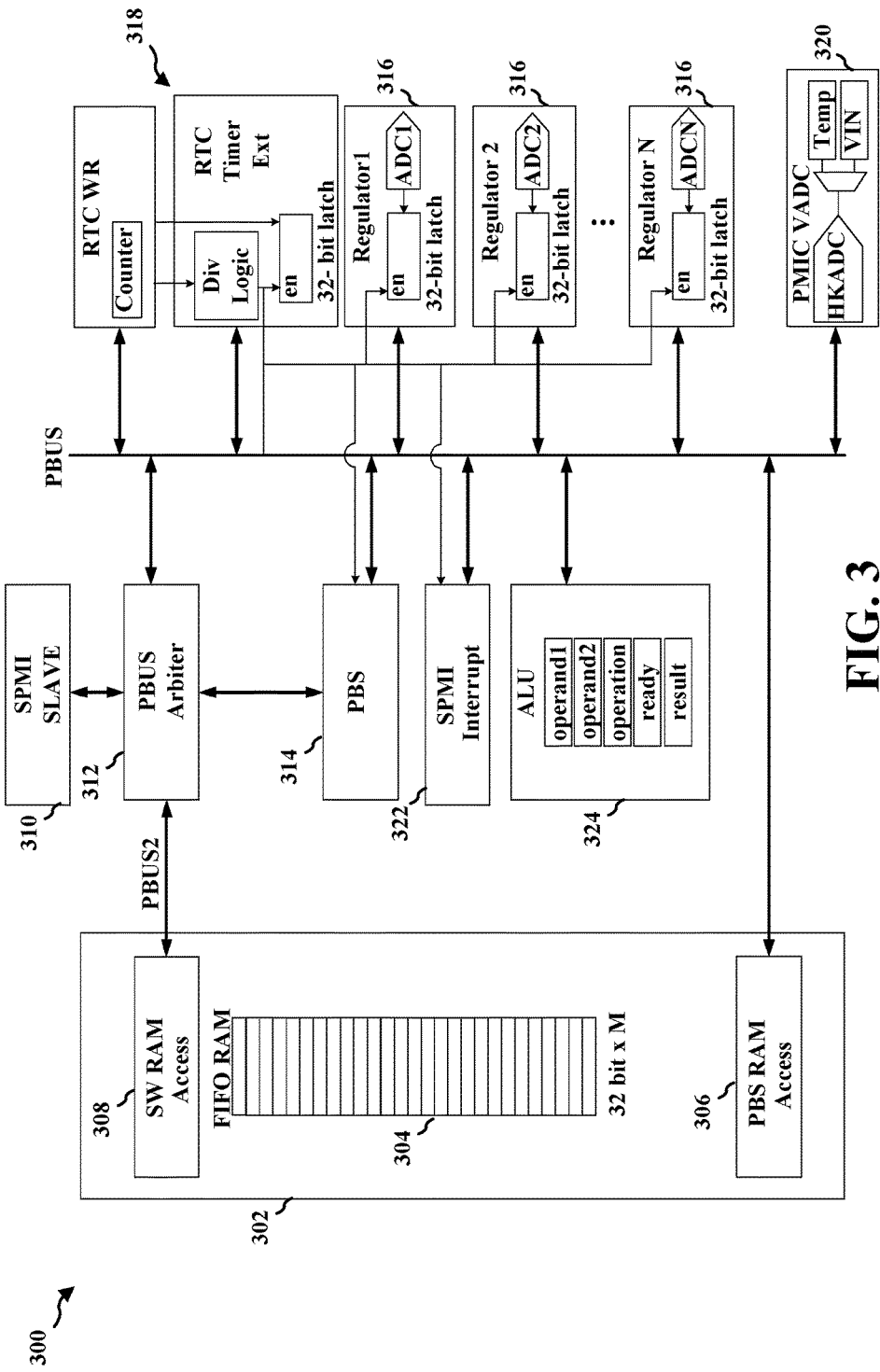
FIG. 3 is a block diagram illustrating an example ECM system architecture in accordance with the systems and methods described herein.

FIG. 3 is a block diagram 300 illustrating an example ECM system architecture in accordance with the systems and methods described herein. The example ECM system architecture may include a memory system 302 to store data, to store instructions, or to store both. The memory system may include a first-in-first-out (FIFO) random access memory (RAM) 304. The FIFO RAM 304 may be accessed over a first bus (PBUS) that may provide PBS RAM access using PBS RAM access 306. The FIFO RAM 304 may be accessed over a second bus (PBUS2) that may provide software access using software RAM access 308. The FIFO RAM 304 may, in an example 65 nm process PMIC implementation, allow for a dense RAM structure.

In some example PMIC implementations, measurements may be taken using infrequent accesses by software running on one or more processors (e.g., >100 msec). Infrequent access may be allowable because FIFO RAM 304 may hold measurements until the software on the one or more processors is ready to access the information.

The example ECM system architecture may include a system performance measurement interface (SPMI) slave 310. The SPMI slave 310 may provide standardized access to local system resource statistics, allowing for the retrieval of information about system performance without using other system resources or without using a large number of other system resources. A PBUS arbiter 312 may arbitrate access the first bus (PBUS) for the SPMI slave 310 and a PBS 314. SPMI slave 310 burst access and the PBUS arbiter 312 may provide fast data transfer over the SPMI.

The PBS 314 may be used for programmable boot sequencing or other sequencing, such as sequencing for power on, sleep, wake-up, warm reset, cold reset, power down and other types of sequencing. The PBS 314 may be re-used as a data-mover and may collect regulator measurements from ECM analog-to-digital converter (ADC) circuitry within regulators 1 to N 316. Dedicated ADCs may make ADC measurements on regulators 1 to N 316. The measurements may be continuous, continual, or periodic, for example.

The PBS 314 may time stamp the data from the measurements from the ECM ADC circuitry using real time clock (RTC) circuitry 318. The RTC circuitry may include a counter and division logic that may generate the time stamps. The time stamp may be a series of bits generated by the counter or by a divided value from the series of bits generated by the counter. For example, the counter may be an up counter that generally increases over time (until it may overflow and begin counting up again). The count values (or a divided version of the count values) may provide a time stamp for the measurements from the ECM ADC circuitry 316. In some examples, the RTC timer (e.g., 1 ms resolution) may broadcasts a sample clock to the system. This sample clock may be a divided counter value that is divided by the division logic.

The example ECM system architecture may include a PMIC voltage ADC (VADC) that may measure voltage in (VIN) to the IC 102 and temperature readings using a house keeping analog-to-digital converter (HKADC). VIN may be used to provide power to regulators 1 to N 316 to provide a series of 1 to N other voltages.

When a measurement is made, the systems and methods described herein may check to determine if the measurement exceeds a threshold. The threshold may be, e.g., software defined. When the measurement exceeds a threshold, SPMI alert circuitry 322 may send an alert. In some examples, the sum of all input channels may be used to determine a total sum of the current used by IC 102. The sum may be checked to determine if the sum exceeds a software defined threshold. If it does, the SPMI interrupt circuitry 322 may send an alert.

The example ECM system architecture may also include a PBS arithmetic logic unit (ALU) 324. The PBS ALU 324 may be used to pre-process data without software assistance, e.g., from other processors within the IC 102 or outside the IC 102. In some examples, the PBS ALU 324 may include various registers to store operands (operand 1, operand 2). The operands are data values on which operations may be performed. In some examples, the PBS ALU 324 may include a register to store an operation to be performed (operation). That is, a code indicating the operation to be performed may be stored in the operation register (operation). In some examples, the PBS ALU 324 may include various registers to indicate a status. Status may include an indication that the PBS ALU 324 is ready to perform an operation (ready). Status may also include previous results of previous operations performed by the PBS ALU 324. In some examples, the PBS ALU 324 may include a register to store a result of an operation (result).

The PBS ALU 324 may be a digital circuit that performs arithmetic and bitwise logical operations on integer binary numbers. In some examples, the PBS ALU 324 may be replaced by a processor or other processing circuitry that may provide greater functionality than the PBS ALU 324.

Some examples of the systems and methods described herein may include means for monitoring current on an IC 102, such as the ECM system 104. In one example, an apparatus for monitoring current in the IC 102 may include means for activating an ECM system 104 within the IC 102. The means for activating the ECM system 104 may include one or more of the processor 116, the current monitor circuit 110, the processor 204, or the other circuitry 206, alone or in combination. For example, the means for activating the ECM system 104 may determine that the ECM system 104 should be activated and may send an activation signal to the ECM system 104 to activate the ECM system 104. The means for activating the ECM system 104 may include PBS ALU 324. Accordingly, in some examples, the apparatus may be self-contained on the IC 102. In other examples, the apparatus may include the IC 102 and other parts of the system 202, such as the processor 204, or the other circuitry 206. Generally, however, the means for activating the ECM system 104 may include one or more of processor 116, current monitor circuit 110, PBS ALU 324 so that the current monitoring functionality may be self-contained within the IC 102.

The example may include means for monitoring the ECM system 104 to measure a set of currents supplied to a set of circuits 114-1, 114-2. The means for monitoring the ECM system 104 may include one or more of the processor 116, the current monitor circuit 110, the processor 204, or the other circuitry 206, alone or in combination. Accordingly, in some examples, the apparatus may be self-contained on the IC 102. In other examples, the apparatus may include the IC 102 and other parts of the system 202, such as the processor 204, or the other circuitry 206. Generally, however, the means for monitoring the ECM system 104 to measure a set of currents supplied to a set of circuits 114-1, 114-2 may include one or more of the processor 116 or the current monitor circuit 110 so that the current monitoring functionality may be self-contained within the IC 102. The means for monitoring the ECM system 104 may include PBS 314.

In some examples, the means for monitoring the current may be configured to perform a number of integrations of at least one current of the set of currents. The integrations may generate an integrated value. The integrated value may be compared to at least one of the thresholds.

In some examples, the means for monitoring the current may be configured to perform a number of differentiations of at least one current of the set of currents. The differentiations may generate a differentiated value that may be compared to at least one of the at least one thresholds.

The example may include means for generating an alert based on at least one current of the set of currents in comparison to at least one threshold. The means for generating an alert may include one or more of the processor 116, the current monitor circuit 110, the processor 204, or the other circuitry 206, alone or in combination. Accordingly, in some examples, the apparatus may be self-contained on the IC 102. In other examples, the apparatus may include the IC 102 and other parts of the system 202, such as the processor 204, or the other circuitry 206. Generally, however, the means for generating an alert may include one or more of the processor 116, the current monitor circuit 110, or the throttle circuit 112 so that the current monitoring functionality may be self-contained within the IC 102. In some examples, at least one of the at least one thresholds includes a maximum current threshold. In some examples, at least threshold may include a maximum positive change in current. The means for generating an alert may include SPMI interrupt 322.

In some examples, the means for generating an alert based on at least one current of the set of currents in comparison to at least one threshold may be configured to generate an alert for at least one of a plurality of power rails in the IC. The alert generated for the at least one of the plurality of power rails may be based on the current to the at least one of the plurality of power rails. In some examples, one alert is generated for each power rail that is not a ground power rail. Each alert may be based on a current to one of the plurality of power rails that is not a ground. (Although non-ground power rails are generally monitored, in some examples, alerts may be based on ground power rails.) Each alert may map to a single power rail.

In some examples, one alert is generated based on a sum of two or more currents. Each current may be from one of the plurality of power rails. In some examples, in addition to the one alert that may be generated based on a sum of two or more currents, one alert may be generated for each power rail of the plurality of power rails in the IC that is not a ground. Each alert generated for each power rail of the plurality of power rails in the IC that is not a ground may be based on a current to one of the plurality of power rails in the IC that is not a ground. Each alert generated for each power rail may map to a single power rail.

The example may include means for throttling a performance of at least one circuit of the set of circuits in order to decrease the current to the at least one circuit based on the generation of the alert. The means for throttling a performance of at least one circuit 114-1, 114-2 of the set of circuits may include one or more of the processor 116, the current monitor circuit 110, the processor 204, or the other circuitry 206, alone or in combination. For example, the throttle circuit 112 may cause one or more of the circuits 114-1, 114-2 to enter a low power mode, the throttle circuit 112 may instruct one or more of the circuits 114-1, 114-2 to use less power, the throttle circuit 112 may instruct one or more of the circuits 114-1, 114-2 to slow down, for example, by reducing the circuits' 114-1, 114-2 clock frequency, the throttle circuit 112 may instruct the power source 108-2 to decrease current or cut off current to one or more of the circuits 114-1, 114-2, to name a few examples. Accordingly, in some examples, the apparatus may be self-contained on IC 102. In other examples, the apparatus may include IC 102 and other parts of the system 202, such as processor 204, or other circuitry 206. Generally, however, the means for throttling a performance of at least one circuit 114-1, 114-2 of the set of circuits may include one or more of the processor 116, the current monitor circuit 110, or the throttle circuit 112 so that the current monitoring functionality may be self-contained within the IC 102. The means for throttling a performance of at least one circuit of the set of circuits may include PBS 314, SPMI interrupt 322, and/or PBS ALU 324.

Figure 4:
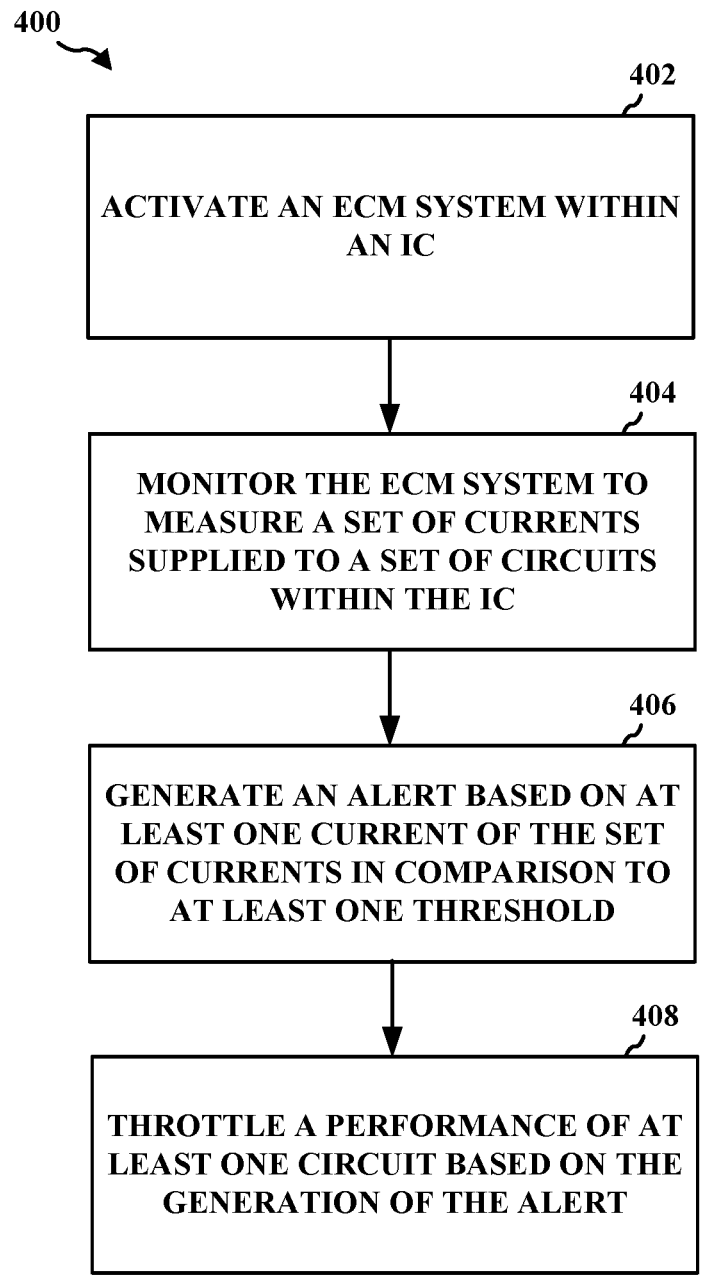
FIG. 4 is a flowchart illustrating an example method of current monitoring of a circuit within an electronic system in accordance with the systems and methods described herein.

FIG. 4 is a flowchart 400 illustrating an example method of current monitoring on an IC within an electronic system in accordance with the systems and methods described herein. The method may monitor current in an IC using an ECM system 104.

In block 402, one or more of the processor 116, current monitor circuit 110, processor 204, other circuitry 206, PBS ALU 324, or some combination of these may activate the ECM system 104 within the IC 102. In some examples, the method may generally be implemented entirely within the IC 102. For example, one or more of the processor 116, other circuitry 206, PBS ALU 324, or some combination of these may activate an ECM system 104 within the IC 102. For example, referring to FIG. 1, processor 116 may determine that the ECM system 104 should be activated and may send an activation signal to the ECM system 104.

In block 404, one or more of the processor 116, processor 204, other circuitry 206, PBS ALU 324, SPMI interrupt 324, or some combination of these may monitor the ECM system 104 to measure a set of currents supplied to a set of circuits. In some examples, the method may generally be implemented entirely within the IC 102. For example, one or more of the processor 116, other circuitry 206, PBS ALU 324, SPMI interrupt 322, or some combination of these may monitor the ECM system 104 to measure a set of currents supplied to a set of circuits within the IC 102. The currents may be measured by one or more current measuring devices 106. The current measuring devices 106 may measure current at one or more power rails. In one specific example, referring back to FIG. 1, the current monitor circuit 110 monitors the ECM system 104 to measure a set of currents supplied to a set of circuits, which the ECM system may measure using the current measuring device 106.

Monitoring the current may include performing a number of integrations of at least one current of the set of currents to generate an integrated value and to compare the integrated value to at least one threshold. Monitoring the current may include performing a number of differentiations of at least one current of the set of currents to generate a differentiated value and to compare the differentiated value to at least one threshold.

In block 406, one or more of the processor 116, processor 204, other circuitry 206, the throttle circuit 112, PBS ALU 324, SPMI interrupt 322, or some combination of these may generate an alert based on at least one current of the set of currents in comparison to at least one threshold. In one example, at least one of the thresholds may be a maximum current. In one example, at least one of the at least one thresholds may be a maximum positive change in current. In some examples, the method may generally be implemented entirely within the IC 102. For example, one or more of the processor 116, other circuitry 206, PBS ALU 324, SPMI interrupt 322, or some combination of these may generate an alert based on at least one current of the set of currents in comparison to at least one threshold. In one specific example, referring back to FIG. 1, the current monitor circuit 110 may generate an alert based on at least one current of the set of currents in comparison to at least one threshold. More specifically, the current from power source 108-2 to the circuit 114-1 may be too high, e.g., the current supplied to the circuit 114-1 may be over a maximum current threshold. Accordingly, the current monitor circuit 110 may generate an alert based on the current to the circuit 114-1 being over a maximum current threshold, for example. In another example, the current from power source 108-4 to the circuit 114-2, external to IC 102, may be too high, e.g., the current supplied to the circuit 114-2 may be over a maximum current threshold. Accordingly, the current monitor circuit 110 may generate an alert based on the current to the circuit 114-2 being over a maximum current threshold, for example.

Generating an alert based on at least one current of the set of currents in comparison to at least one threshold may include generating an alert for at least one of a plurality of power rails in the IC. The power rails may be connection points where power is distributed to the IC 102. The IC may use multiple voltage levels and, accordingly, the IC may have a plurality of power rails. Generally the IC will have at least two power rails, e.g., a ground and a positive or negative voltage source.

The alert may be generated for at least one of the plurality of power rails based on the current to the at least one of the plurality of power rails. In some examples, one alert is generated for each power rail that is not a ground power rail. Each alert may be based on a current to one of the plurality of power rails that is not a ground. Each alert may map to a single power rail. An alert may be generated based on a sum of two or more currents, each current to one of the plurality of power rails. In addition to the one alert that is generated based on a sum of two or more currents, one alert may be generated for each power rail of the plurality of power rails in the IC that is not a ground. Each alert generated for each power rail of the plurality of power rails in the IC that is not a ground may be based on a current to one of the plurality of power rails in the IC that is not a ground. Additionally, each alert generated for each power rail maps to a single power rail.

In block 408, one or more of the processor 116, processor 204, the other circuitry 206, the throttle circuit 112, PBS ALU 324, SPMI interrupt 322, or some combination of these may throttle a performance of at least one circuit of the set of circuits in order to decrease the current to the at least one circuit 114-1, 114-2 based on the generation of the alert. In some examples, the method may generally be implemented entirely within the IC 102. For example, one or more of the processor 116, other circuitry 206, PBS ALU 324, SPMI interrupt 322, the throttle circuit 112 or some combination of these may throttle a performance of at least one circuit of the set of circuits within the IC 102 in order to decrease the current to the at least one circuit 114-1, 114-2 based on the generation of the alert. In one example, the throttle circuit 112 may throttle a performance of at least one circuit 114-1, 114-2 of the set of circuits within the IC 102 in order to decrease the current, decrease a change in current, or otherwise change some aspect of the current usage to the at least one circuit 114-1, 114-2 based on the generation of the alert. For example, the throttle circuit 112 may signal at least one of the circuits 114-1, 114-2 to enter a low power mode or otherwise decrease power consumption when power consumption is too high, e.g., over a maximum current threshold. In other examples, changes in current, total current over a time period, or other functions of current may be compared to thresholds. The throttling used may be based on the particular alert. For example, for alerts based on changes in current, the throttle circuit 112 may instruct or request at least one of the circuits 114-1, 114-2 to level out current usage or to decrease current usage. For alerts based on total current used over a time period, the throttle circuit 112 may instruct at least one of the circuits 114-1, 114-2 to decrease current usage over time.

The throttle circuit 112 may be configured to throttle the performance of at least one circuit 114-1, 114-2 of the set of circuits within the IC in order to decrease the current to the at least one circuit based on the generation of the alert. The throttle circuit 112 may use current usage information to throttle performance of the IC 102 before an over-temperature event or battery dip shuts down a mobile electronic device incorporating the IC 102. Because the ECM system 104 may provide a breakdown of currents on each power rail, current limiting software in the mobile electronic device, e.g., running on a processor 116 on the IC 102, or a processor within throttle circuit 112, may selectively decide which sub-system to throttle. In some examples, the throttle circuit 112 may throttle a performance of at least one of the circuits 114-1, 114-2 directly, e.g., by signaling at least one of the circuits 114-1, 114-2 to enter a lower power state or signaling at least one of the circuits 114-1, 114-2 to slow processing, or by otherwise signaling at least one of the circuits 114-1, 114-2 to reduce the current draw to at least one of the circuits 114-1, 114-2 in some way. In some examples, the throttle circuit 112 may signal one of the power sources 108 and the power source 108 may decrease current to a circuit or circuits to which the power source 108 is supplying power.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A current measuring circuit comprising:
    an embedded current measuring (ECM) system;
    a current monitor circuit configured to monitor the ECM system to measure a set of currents supplied to a set of circuits;
    an alert circuit configured to generate an alert for at least one of a plurality of power rails in a circuit being monitored based on at least one current of the set of currents in comparison to at least one threshold, the current to the at least one of the plurality of power rails, the alert circuit generating one alert for each power rail that is not a ground power rail, wherein each alert is based on a current to one of the plurality of power rails that is not a ground and each alert maps to a single power rail; and
    a throttle circuit configured to throttle a performance of at least one circuit of the set of circuits in order to decrease the current to the at least one circuit based on the generation of the alert.

2. The current measuring circuit of claim 1, wherein at least one of the at least one thresholds comprises a maximum current.

3. The current measuring circuit of claim 1, wherein at least one of the at least one thresholds comprises a maximum positive change in current.

4. The current measuring circuit of claim 1, wherein the current monitor circuit is further configured to monitor the current by performing a number of integrations of at least one current of the set of currents to generate an integrated value and to compare the integrated value to at least one of the at least one thresholds.

5. The current measuring circuit of claim 1, wherein the current monitor circuit is further configured to monitor the current by performing a number of differentiations of at least one current of the set of currents to generate a differentiated value and to compare the differentiated value to at least one of the at least one thresholds.

6. The current measuring circuit of claim 1, wherein the alert circuit is further configured to generate one alert based on a sum of two or more currents, each current to one of the plurality of power rails.

7. The current measuring circuit of claim 6, wherein the alert circuit is further configured to generate, in addition to the one alert that is generated based on a sum of two or more currents, one alert for each other power rail of the plurality of power rails in the circuit that is not a ground,
    wherein each alert generated for each power rail of the plurality of power rails in the circuit that is not a ground is based on a current to one of the plurality of power rails in the circuit that is not a ground, and
    wherein each alert generated for each power rail maps to a single power rail.

8. A method of monitoring current in a set of circuits comprising:
    activating an embedded current measuring (ECM) system;
    monitoring the ECM system to measure a set of currents supplied to the set of circuits;
    generating an alert based on at least one current of the set of currents in comparison to at least one threshold including generating an alert for at least one of a plurality of power rails, the alert generated for the at least one of the plurality of power rails based on the current to the at least one of the plurality of power rails, one alert is generated for each power rail that is not a ground power rail, wherein each alert is based on a current to one of the plurality of power rails that is not a ground and each alert maps to a single power rail; and throttling a performance of at least one circuit of the set of circuits in order to decrease the current to the at least one circuit based on the generation of the alert.

9. The method of claim 8, wherein at least one of the at least one thresholds comprises a maximum current.

10. The method of claim 8, wherein at least one of the at least one thresholds comprises a maximum positive change in current.

11. The method of claim 8, wherein monitoring the current comprises performing a number of integrations of at least one current of the set of currents to generate an integrated value and to compare the integrated value to at least one of the at least one thresholds.

12. The method of claim 8, wherein monitoring the current comprises performing a number of differentiations of at least one current of the set of currents to generate a differentiated value and to compare the differentiated value to at least one of the at least one thresholds.

13. The method of claim 8, wherein another alert is generated based on a sum of two or more currents, each current to one of the plurality of power rails.

14. The method of claim 13, wherein, in addition to the alert that is generated based on a sum of two or more currents and the alert for the at least one of the plurality of power rails, one alert is generated for each other power rail of the plurality of power rails that is not a ground, wherein each alert generated for each power rail of the plurality of power rails that is not a ground is based on a current to one of the plurality of power rails that is not a ground, and wherein each alert generated for each power rail maps to a single power rail.

15. An apparatus for monitoring current in a set of circuits comprising:

means for activating an embedded current measuring (ECM) system;

means for monitoring the ECM system to measure a set of currents supplied to the set of circuits;

means for generating an alert based on at least one current of the set of currents in comparison to at least one threshold, including generating an alert for at least one of a plurality of power rails, the alert generated for the at least one of the plurality of power rails based on the current to the at least one of the plurality of power rails, one alert is generated for each power rail that is not a ground power rail, wherein each alert is based on a current to one of the plurality of power rails that is not a ground and each alert maps to a single power rail; and means for throttling a performance of at least one circuit of the set of circuits in order to decrease the current to the at least one circuit based on the generation of the alert.

16. The apparatus of claim 15, wherein at least one of the at least one thresholds comprises a maximum current.

17. The apparatus of claim 15, wherein at least one of the at least one thresholds comprises a maximum positive change in current.

18. The apparatus of claim 15, wherein the means for monitoring the current is configured to perform a number of integrations of at least one current of the set of currents to generate an integrated value and to compare the integrated value to at least one of the at least one thresholds.

19. The apparatus of claim 15, wherein the means for monitoring the current is configured to perform a number of differentiations of at least one current of the set of currents to generate a differentiated value and to compare the differentiated value to at least one of the at least one thresholds.

20. The apparatus of claim 15, wherein another alert is generated based on a sum of two or more currents, each current to one of the plurality of power rails.

21. The apparatus of claim 20, wherein, in addition to the alert that is generated based on a sum of two or more currents and the alert for the at least one of a plurality of power rails, one alert is generated for each other power rail of the plurality of power rails that is not a ground, wherein each alert generated for each power rail of the plurality of power rails that is not a ground is based on a current to one of the plurality of power rails that is not a ground, and wherein each alert generated for each power rail maps to a single power rail.

* * * * *